United States Patent [19]
Moon

[11] Patent Number: 5,669,752
[45] Date of Patent: Sep. 23, 1997

[54] SEMICONDUCTOR WAFER PRE-ALIGNING APPARATUS

[75] Inventor: Chang-youl Moon, Uiwang, Rep. of Korea

[73] Assignee: Samsung Electronics Co., Ltd., Suwon, Rep. of Korea

[21] Appl. No.: 680,871

[22] Filed: Jul. 16, 1996

[30] Foreign Application Priority Data

Dec. 13, 1995 [KR] Rep. of Korea ............ 95-49284

[51] Int. Cl.$^6$ ............................................. B65G 49/07
[52] U.S. Cl. .................... 414/783; 414/936; 414/941; 198/394
[58] Field of Search ........................ 414/783, 936, 414/941, 935; 198/394

[56] References Cited

U.S. PATENT DOCUMENTS

| | | | |
|---|---|---|---|
| 4,770,600 | 9/1988 | Ishikawa | 414/783 |
| 5,054,991 | 10/1991 | Kato | 414/783 |
| 5,183,378 | 2/1993 | Asano et al. | 414/936 |
| 5,224,586 | 7/1993 | Naka et al. | 198/394 |
| 5,570,994 | 11/1996 | Somekh et al. | 414/941 |

FOREIGN PATENT DOCUMENTS

| | | | |
|---|---|---|---|
| 162342 | 7/1987 | Japan | 414/936 |
| 182833 | 7/1988 | Japan | 414/936 |
| 140739 | 6/1989 | Japan | 414/936 |
| 34345 | 2/1991 | Japan | 414/936 |

*Primary Examiner*—Karen B. Merritt
*Assistant Examiner*—Douglas Hess
*Attorney, Agent, or Firm*—Burns, Doane, Swecker & Mathis, LLP

[57] ABSTRACT

A semiconductor wafer pre-aligning apparatus includes a wafer transfer unit for transferring a semiconductor wafer, and a wafer stopping unit for stopping and disposing the transferred semiconductor wafer on a predetermined position of a transferring path. The wafer stopping unit includes a stop elevatably disposed on the wafer transferring path and having a plurality of stepped and arc-shaped walls whose radii are different from one another but whose curvature centers coincide, and a device for elevating the wafer stopping unit. Thus, changes in wafer size can be dealt with easily and a clean work environment for wafer treatment can be maintained.

4 Claims, 4 Drawing Sheets

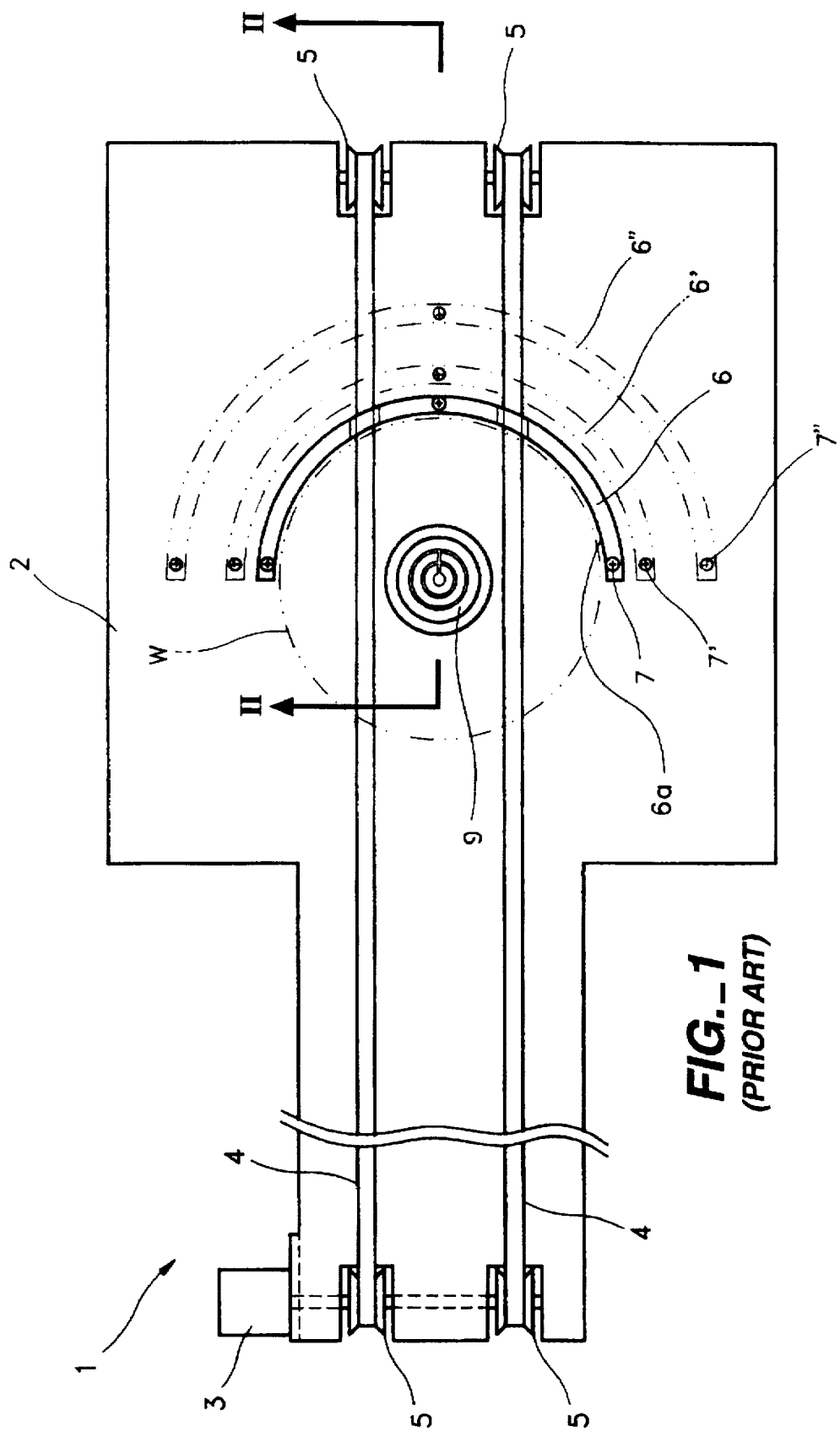
FIG._1 (PRIOR ART)

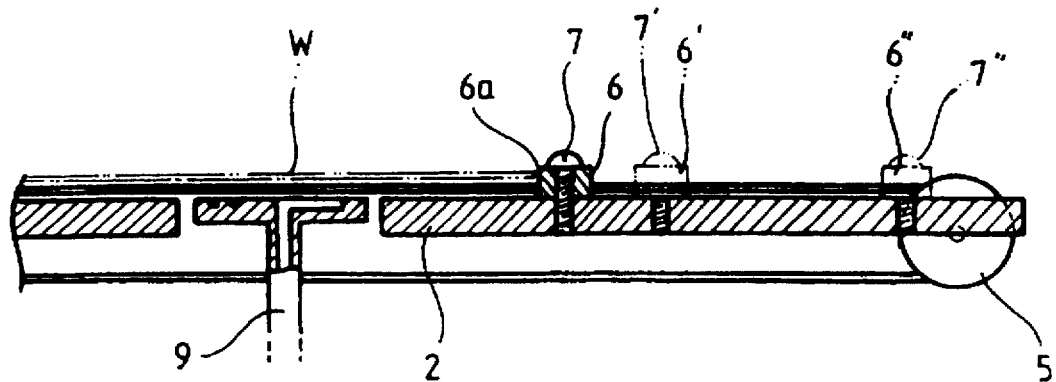
FIG._2
*(PRIOR ART)*
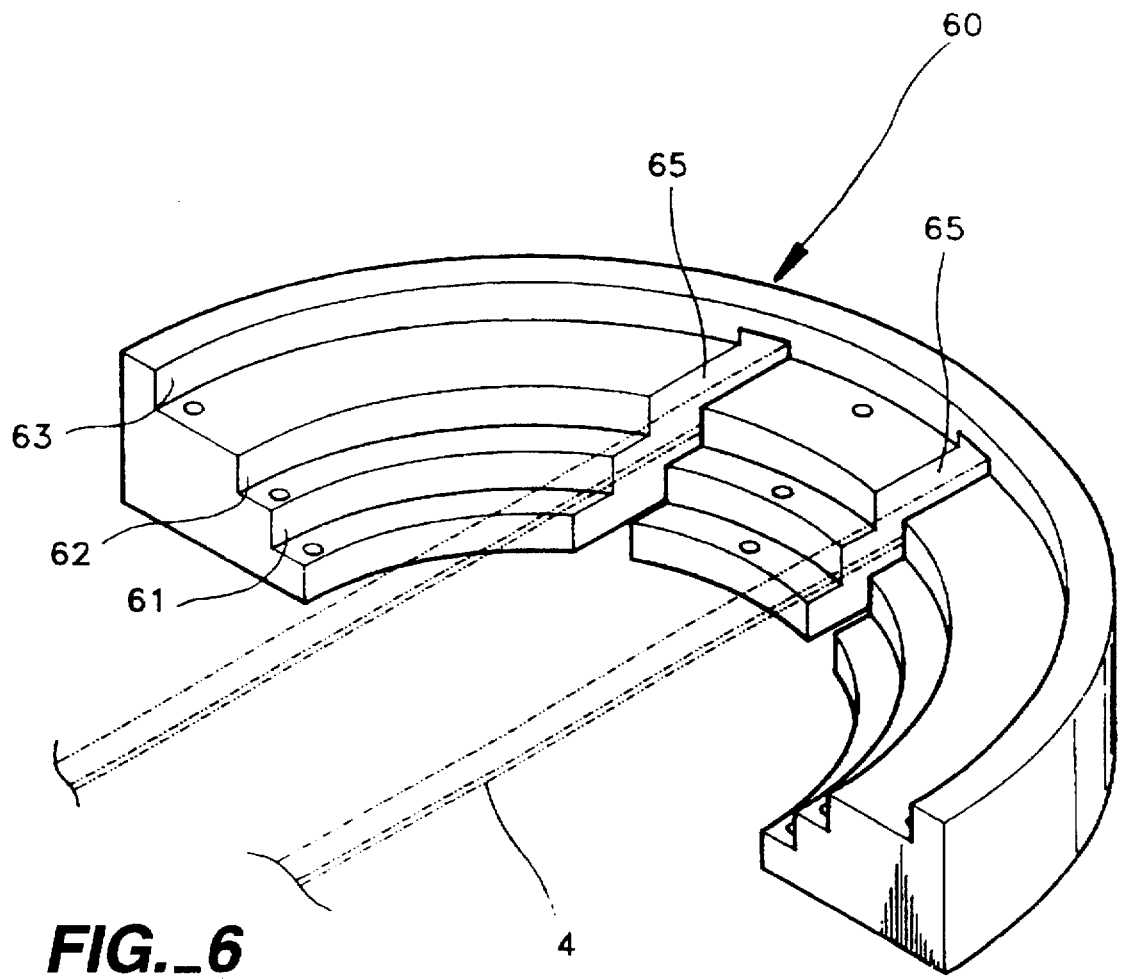
FIG._6

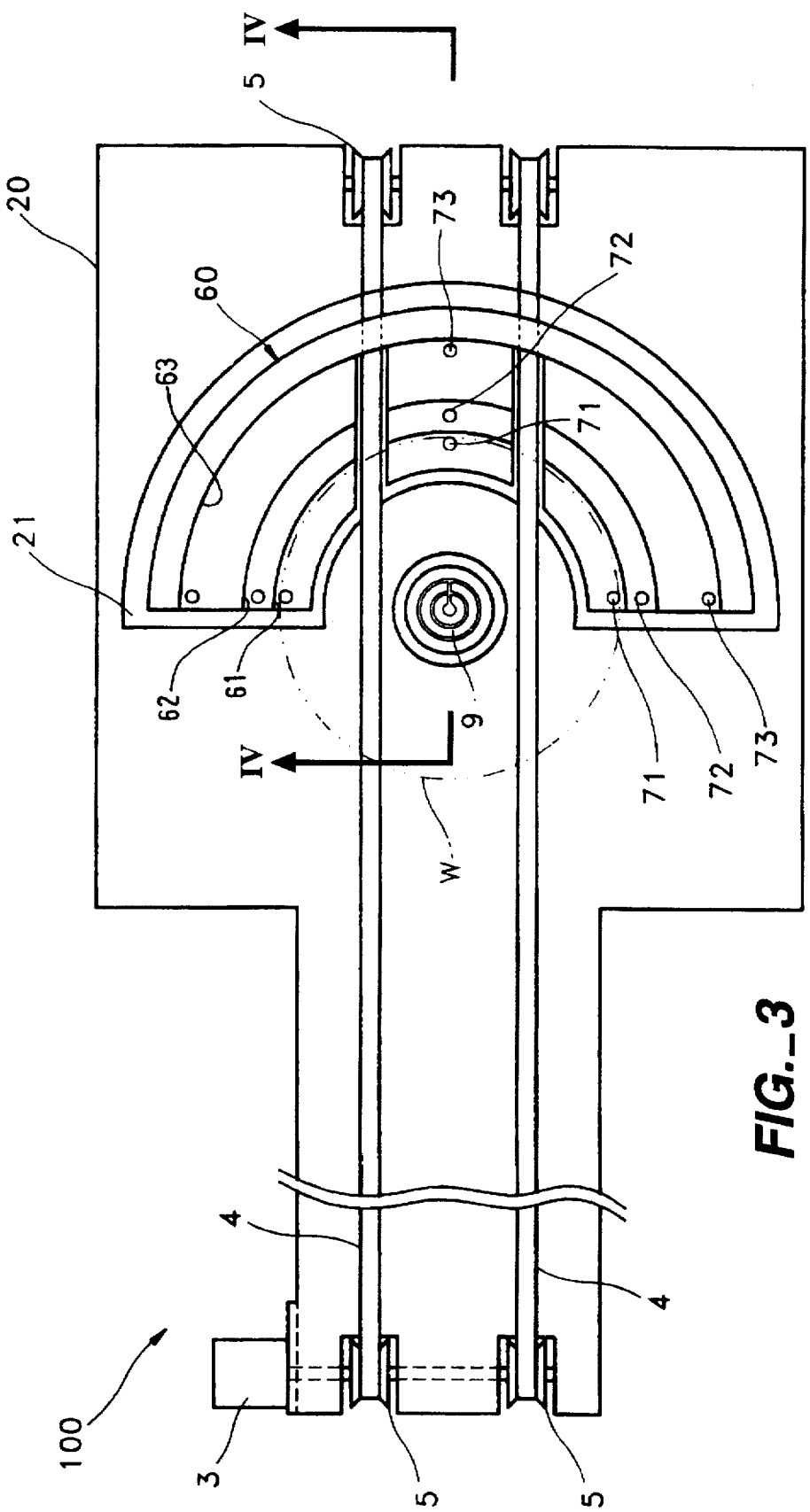
FIG._3

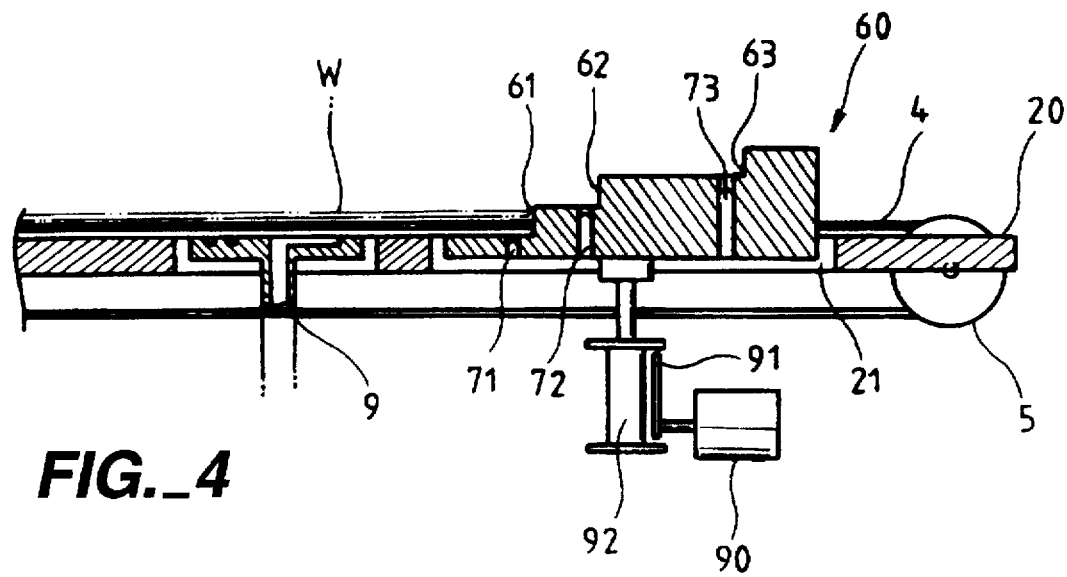
FIG._4
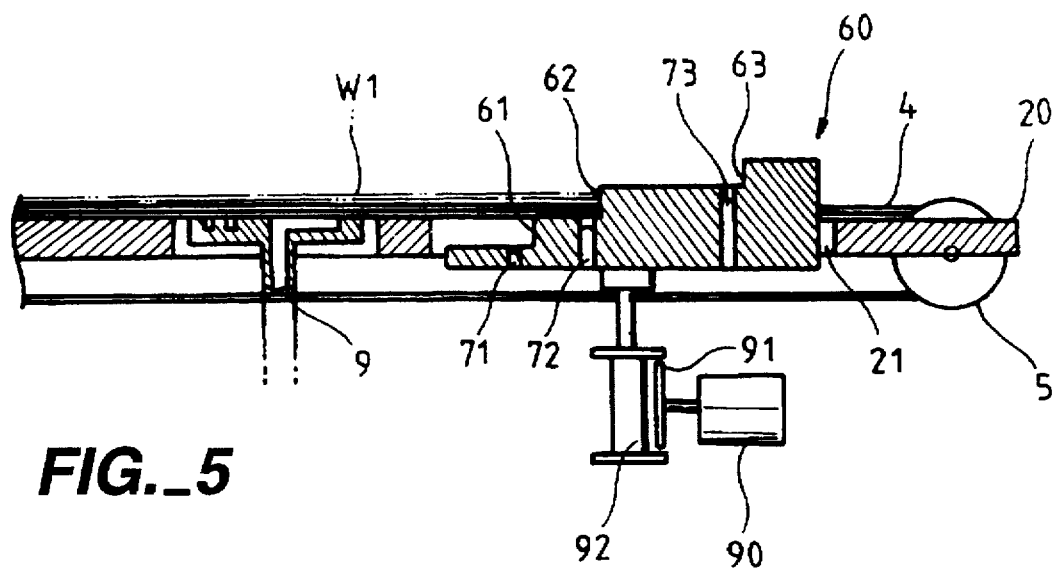
FIG._5

5,669,752

1

SEMICONDUCTOR WAFER PRE-ALIGNING APPARATUS

BACKGROUND OF THE INVENTION

The present invention relates to a semiconductor wafer pre-aligning apparatus, and particularly to a semiconductor wafer pre-aligning apparatus capable of coping with changes in semiconductor wafer size easily.

The process of manufacturing a large number of semiconductor chips using a semiconductor wafer needs a semiconductor wafer pre-aligning apparatus.

FIGS. 1 and 2 show a conventional semiconductor wafer pre-aligning apparatus.

Referring to FIGS. 1 and 2, a semiconductor wafer pre-aligning apparatus 1 is constituted by a frame 2, a suction nozzle 9 elevatably disposed on the center of the frame 2 for holding and rotating a semiconductor wafer W thereon, a motor 3 fixed to one side of the frame 2, a pair of belts 4 which are driven by the motor 3, for transferring the semiconductor wafer W onto the suction nozzle, and a stop 6 fixed to the frame 2 by screws 7 for stopping the semiconductor wafer W transferred by the belts 4. The stop 6 is equipped with an arc-shaped wall 6a for holding the semiconductor wafer W by direct contact with the circumference of the wafer. The wall 6a has nearly the same radius as that of the transferred wafer W. The reference number B indicates a pulley on which the belts 4 are hung.

In such a semiconductor wafer pre-aligning apparatus 1, when the motor 3 is operated after the semiconductor wafer W is laid on the belts 4, the belts 4 move to transfer the semiconductor wafer W onto the suction nozzle 9. The semiconductor wafer W thus transferred is stopped by the wall 6a of the stop 6 and is laid on the suction nozzle 9. Then, the suction nozzle 9 is raised by a driving source (not shown) to grasp and elevate the semiconductor wafer W, rotate it by a predetermined angle and determine its rotating position.

However, it is difficult for such a conventional semiconductor pre-aligning apparatus 1 to cope with a wafer size change quickly. That is, when a wafer size is changed from five inches to six inches or from six inches to eight inches, in diameter, the stop 6 (or 6') fixed to the frame 2 for the previous wafer size should be substituted with a new stop 6' (or 6") whose wall has the same radius as that of the changed wafer. The reference numbers 7' and 7" indicate screws for fixing the stops 6' and 6" to the frame 2, respectively.

However, it is considerably cumbersome for an operator to perform such stop changing whenever the wafer size is changed. Moreover, as a semiconductor wafer needs a high degree of cleanness, entering a workroom for interchanging the stops is undesirable.

SUMMARY OF THE INVENTION

The object of the present invention is to provide a semiconductor wafer pre-aligning apparatus capable of coping with changes in wafer size easily and maintaining a clean work environment for wafer treatment.

To obtain the object, there is provided a semiconductor wafer pre-aligning apparatus comprising:

a wafer transfer unit for transferring a semiconductor wafer; and a wafer stopping unit for stopping and disposing the transferred semiconductor wafer on a predetermined position of a transferring path, wherein the wafer stopping unit comprising:

2 a stop elevatably disposed on the wafer transferring path and having a plurality of stepped and arc-shaped walls whose radii are different from one another but whose curvature centers coincide; and means for elevating the wafer stopping unit.

BRIEF DESCRIPTION OF THE DRAWINGS

The above object and advantage of the present invention will become more apparent by describing in detail a preferred embodiment thereof with reference to the attached drawings in which:

FIG. 1 is a plan view of a conventional semiconductor wafer pre-aligning apparatus;

FIG. 2 is a sectional view taken along line II—II of FIG. 1;

FIG. 3 is a plan view showing a semiconductor wafer pre-aligning apparatus according to an embodiment of the present invention;

FIG. 4 is a sectional view taken along line IV—IV of FIG. 3;

FIG. 5 is a sectional view showing the state of a stop descended by a predetermined height from the state shown in FIG. 4; and FIG. 6 is a perspective view of the stop shown in FIGS. 3-5.

DETAILED DESCRIPTION OF THE INVENTION

According to FIG. 3, a semiconductor wafer pre-aligning apparatus 100 according to an embodiment of the present invention includes a frame 20, a suction nozzle 9 elevatably disposed on the center of the frame 20 for holding and rotating a semiconductor wafer W thereon, and a wafer transfer unit for transferring the wafer W. The wafer transfer unit is comprised of a motor 3 fixed to the frame 20, and a pair of belts 4 driven by the motor 3 for transferring the wafer onto the suction nozzle 9.

In addition, the above semiconductor wafer pre-aligning apparatus 100 according to the present invention further includes a wafer stopping unit for stopping the wafer transferred by the wafer transfer unit and disposing it on the suction nozzle 9. The wafer stopping unit is comprised of a stop 60 elevatably disposed around the suction nozzle 9, and means for elevating the stopping member 60.

The stop 60 is equipped with a plurality of stepped walls 61, 62 and 63. The radii of these walls 61, 62 and 63 are different one another, but their centers of curvature are located on the same vertical line. For example, in the embodiment of the present invention, the radius of the first wall 61 is designed to be nearly the same as that of a five-inch wafer, the radius of the second wall 62 is nearly the same as that of a six-inch wafer, and the radius of the third wall 63 is nearly the same as that of an eight-inch wafer. In FIG. 6, reference number 65 indicates a recessed portion formed in the stop 60 to prevent the stopping member 60 from clashing with the belts 4 in its elevating process.

Referring to FIGS. 4 and 5, the elevating means for elevating the stop 60 is comprised of an elevating motor 90, a cam 91 connected to the output shaft of the elevating motor 90, and a cam follower 92 fixed to the stop 60 one end of which is in contact with the circumferential surface of the cam 91, and capable of being elevated according to rotation of the cam 91.

Additionally, it is further desirable that a plurality of sensors 71, 72 and 73 are installed beneath surfaces of the stop 60 on which wafers are laid, adjacent to the walls 61, 62 and 63 respectively.

Next, the operation of the semiconductor wafer pre-aligning apparatus 100 according to the present invention will be described below.

To pre-align a five-inch semiconductor wafer W in diameter on the suction nozzle 9, the stop 60 is raised so that the first wall 61 can be positioned on a wafer transferring path as shown in FIG. 4, and then the wafer is laid on the belts 4. The motor 3 drives the belts 4 to transfer the wafer W. The wafer thus transferred is stopped when the circumferential surface thereof contacts the first wall 61 of the stop 60 and is laid on the suction nozzle 9. When the wafer W is laid onto the suction nozzle 9, the suction nozzle 9 is raised to grasp and rotate the wafer W by a predetermined angle and determine its rotating position.

When the wafer size is changed to six inches in diameter, the elevating motor 90 operates to rotate the cam 91 by a predetermined angle. Then, as shown in FIG. 5, the cam follower 92 descends by a predetermined height so that the second wall 62 of the stop 60 can be positioned on the wafer transferring path. In this state, when a six-inch wafer W1 is laid on the belts 4 to then be transferred, the transferred wafer W1 comes in contact with the second wall 62 of the stop 60 to be stopped and thus be laid on the suction nozzle 9. Here, because the radius of the second wall 62 is nearly the same as that of the six-inch wafer W1 and the center of curvature of the second wall 62 coincides with that of the first wall 61, the center of the six-inch wafer W1 coincides with that of the five-inch wafer W.

In the same way, to pre-align an eight-inch semiconductor wafer, the stop 60 descends by a predetermined height from the state shown in FIG. 5, by a rotation of the elevating motor 90, so that the third wall 63 can be positioned on the transferring path of the wafer, and then the eight-inch wafer is transferred.

If the sensors 71, 72 and 73 are installed beneath each surface of the stop 60 on which a wafer is laid, it is possible to determine whether the wafer with a wanted size is disposed on a proper position and thus improper wafer pre-alignment due to erroneous operation of the stop 60 can be prevented.

As described above, the a semiconductor wafer pre-aligning apparatus according to the present invention has the stepped stop capable of coping with changes in wafer size easily and maintaining a clean work environment for wafer treatment.

What is claimed is:

1. A semiconductor wafer pre-aligning apparatus comprising:

a wafer transfer unit for transferring a semiconductor wafer; and a wafer stopping unit for stopping and disposing said transferred semiconductor wafer on a predetermined position of a transferring path, wherein said wafer stopping unit comprises:

a stop elevatably disposed on said wafer transferring path and having a plurality of stepped and arc-shaped walls whose radii are different from one another but whose curvature centers coincide; and means for elevating said wafer stopping unit.

2. The semiconductor wafer pre-aligning apparatus as claimed in claim 1, wherein said elevating means comprises:

an elevating motor;

a cam combined with an output shaft of said elevating motor; and a cam follower, combined with said stop, one end of said stop is in contact with a circumferential surface of said cam and is capable of being elevated by a rotation of said cam.

3. The semiconductor wafer pre-aligning apparatus as claimed in claim 1, said apparatus further comprising at least one sensor for sensing whether the circumference of said transferred semiconductor wafer is properly positioned against said stop.

4. The semiconductor wafer pre-aligning apparatus as claimed in claim 2, said apparatus further comprising at least one sensor for sensing whether the circumference of said transferred semiconductor wafer is properly positioned against said stop.

* * * * *